United States Patent
Park et al.

(10) Patent No.: US 9,336,857 B2
(45) Date of Patent: May 10, 2016

(54) SEMICONDUCTOR MEMORY DEVICE INCLUDING STACKED MEMORY CHIPS

(71) Applicant: SK hynix Inc., Gyeonggi-do (KR)

(72) Inventors: Min-Su Park, Gyeonggi-do (KR); Young-Jun Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/535,075

(22) Filed: Nov. 6, 2014

(65) Prior Publication Data
US 2015/0302915 A1    Oct. 22, 2015

(30) Foreign Application Priority Data
Apr. 22, 2014    (KR) .................... 10-2014-0048311

(51) Int. Cl.
*G11C 11/4093*    (2006.01)
*G11C 7/10*    (2006.01)

(52) U.S. Cl.
CPC .............. *G11C 11/4093* (2013.01); *G11C 7/10* (2013.01); *G11C 7/1066* (2013.01)

(58) Field of Classification Search
CPC ........... G11C 11/4093; G11C 11/4096; G11C 7/1051; G11C 7/1078; G11C 7/1039
USPC .......................................... 365/189.05, 154
See application file for complete search history.

(56) References Cited

U.S. PATENT DOCUMENTS

| 2011/0187408 A1* | 8/2011 | Byeon ................. H03K 19/173 326/37 |
| 2011/0188331 A1* | 8/2011 | Jin ........................... G11C 7/00 365/193 |
| 2012/0007624 A1* | 1/2012 | Byeon ..................... G11C 7/10 324/750.15 |
| 2013/0258788 A1* | 10/2013 | Ide .......................... G11C 7/10 365/189.05 |

FOREIGN PATENT DOCUMENTS

KR    1020130050388    5/2013

* cited by examiner

*Primary Examiner* — Alexander Sofocleous
*Assistant Examiner* — Alfredo Bermudez Lozada
(74) *Attorney, Agent, or Firm* — IP&T Group LLP

(57) ABSTRACT

A semiconductor memory device includes: a master chip suitable for generating a plurality of first control signals and a second control signal based on a read command; and a plurality of slave chips each suitable for latching data read from a plurality of memory cells included in a corresponding slave chip and transmitting the latched data to the master chip based on a correspond control signal of the first control signals, wherein the master chip latches the data transmitted from the slave chips based on the first control signals and outputs the data latched in the master chip based on the second control signal.

11 Claims, 4 Drawing Sheets

(a)

(b)

SEMICONDUCTOR MEMORY DEVICE INCLUDING STACKED MEMORY CHIPS

CROSS-REFERENCE TO RELATED APPLICATIONS

The present application claims priority of Korean Patent Application No. 10-2014-0048311, filed on Apr. 22, 2014, which is incorporated herein by reference in its entirety.

BACKGROUND

1. Field

Various embodiments of the present invention relate to a semiconductor memory device, and more particularly, to a semiconductor device including stacked memory chips.

2. Description of the Related Art

Semiconductor devices include semiconductor memory devices such as a dynamic random access memory (DRAM), and are widely used in various electronic systems. As electronic systems are gradually scaled down and their performance is improved, semiconductor devices included in the electronic systems are continuously being developed to satisfy the operation speed and process capability (e.g., bandwidth) that are required in the electronic systems. Particularly, various technologies for the semiconductor memory devices are being researched and developed to store large-capacity data and process the data at a high speed.

Among the technologies is a high bandwidth memory (HBM) device. To develop a HBM device capable of processing large-capacity data at a high speed, memory chips are fabricated in high integration. That is, numerous memory cells are integrated and fabricated in a limited space of a semiconductor chip. However, there is a limitation in highly integrating the memory cells in terms of fabrication process technology. The limitation may be overcome by packaging the memory chips or dies in a three-dimensional (3D) structure in which the fabricated memory chips or dies are stacked.

A stacked package of the semiconductor memory device includes stacking two or more semiconductor chips vertically. For example, the stacked package of the semiconductor memory device may have at least twice as much memory capacity as the memory capacity that may be realized through a semiconductor integration process. However, a difference among the parameters of the semiconductor chips located at different slices may occur due to variations in the process, voltage, and temperature (PVT). For example, an AC parameter, such as address access delay time (tAA), which indicates the time from read command input to a data output, may vary, and consequently a skew occurs between data outputted from the different slices.

FIG. 1 is a block diagram illustrating a conventional semiconductor memory device. FIG. 1 shows a data output circuit of the semiconductor memory device in which three semiconductor chips are stacked.

Referring to FIG. 1, the semiconductor memory device includes one master chip 100 and two slave chips 200 and 300. The master chip 100 includes a pipe latch 120 and outputs data DATA1 and DATA2, which are transmitted through one channel from the slave chips 200 and 300, to a data pad DQ. A buffer (or transmitter) 110, 210, 220, 310, or 320 may be further included as an input or output circuit of each chip 100, 200, or 300.

The slave chips 200 and 300 output a control signal PIN together with the data DATA1 and DATA2 to the master chip 100 when the data DATA1 and DATA2 are outputted from a core region based on a read command. After latching the data DATA1 and DATA2 transmitted from the slave chips 200 and 300 based on the control signal PIN, the master chip 100 outputs the latched data DATA1 and DATA2 to the data pad DQ in time for column address strobe (CAS) latency. When there is no parameter difference between the slave chips 200 and 300 and no skew occurs between data which are outputted from the slave chips 200 and 300, the data transmitted through one channel are normally combined through the master chip 100. However, when there is the parameter difference between the slave chips 200 and 300, and a skew occurs between the data which are outputted from the slave chips 200 and 300, it is difficult for the master chip 100 to secure accurate eye patterns of the data transmitted through one channel.

An operation of the semiconductor memory device shown in FIG. 1 and related issues are described below in detail with reference to the timing diagrams of FIG. 2 illustrating output data.

FIG. 2 illustrates timing diagrams of the data outputted from the semiconductor memory device shown in FIG. 1. FIG. 2 shows a case (a) in which a skew does not occur between the data outputted from the slave chips and a case (b) in which the skew occurs between the data outputted from the slave chips.

Referring to FIG. 2, in case of (a), the data DATA1 and DATA2 are outputted from the first slave chip 200 and the second slave chip 300 at the same time based on read commands RD1 and RD2, and the data which are normally combined are outputted to the data pad DQ through one channel. However, in case of (b), the data DATA1 and DATA2 are outputted at different times due to the parameter difference between the first slave chip 200 and the second slave chip 300. For example, the first slave chip 200 outputs the data later than the second slave chip 300, and thus the data where the skew occurs are then outputted to the data pad DQ.

SUMMARY

Various embodiments of the present invention are directed to a semiconductor memory device that may correct a skew occurring between data by controlling timings of the data outputted from a plurality of memory chips.

In accordance with an embodiment of the present invention, a semiconductor memory device includes a master chip suitable for generating a plurality of first control signals and a second control signal based on a read command, and a plurality of slave chips each suitable for latching data read from a plurality of memory cells included in a corresponding slave chip and transmitting the latched data to the master chip based on a correspond control signal of the first control signals, wherein the master chip latches the data transmitted from the slave chips based on the first control signals and outputs the data latched in the master chip based on the second control signal.

In accordance with another embodiment of the present invention, a semiconductor memory device includes a plurality of stacked memory chips each suitable for reading data from a plurality of memory cells included therein in response to a read command and outputting the read data in response to a corresponding control signal of a plurality of first control signals. A first memory chip among the memory chips includes a control signal generation block suitable for generating the first control signals and a second control signal based on the read command, and a first pipe latch block suitable for latching the data outputted from the memory chips based on the first control signals and outputting the latched data to a data pad based on the second control signal.

DETAILED DESCRIPTION

Figure 1:
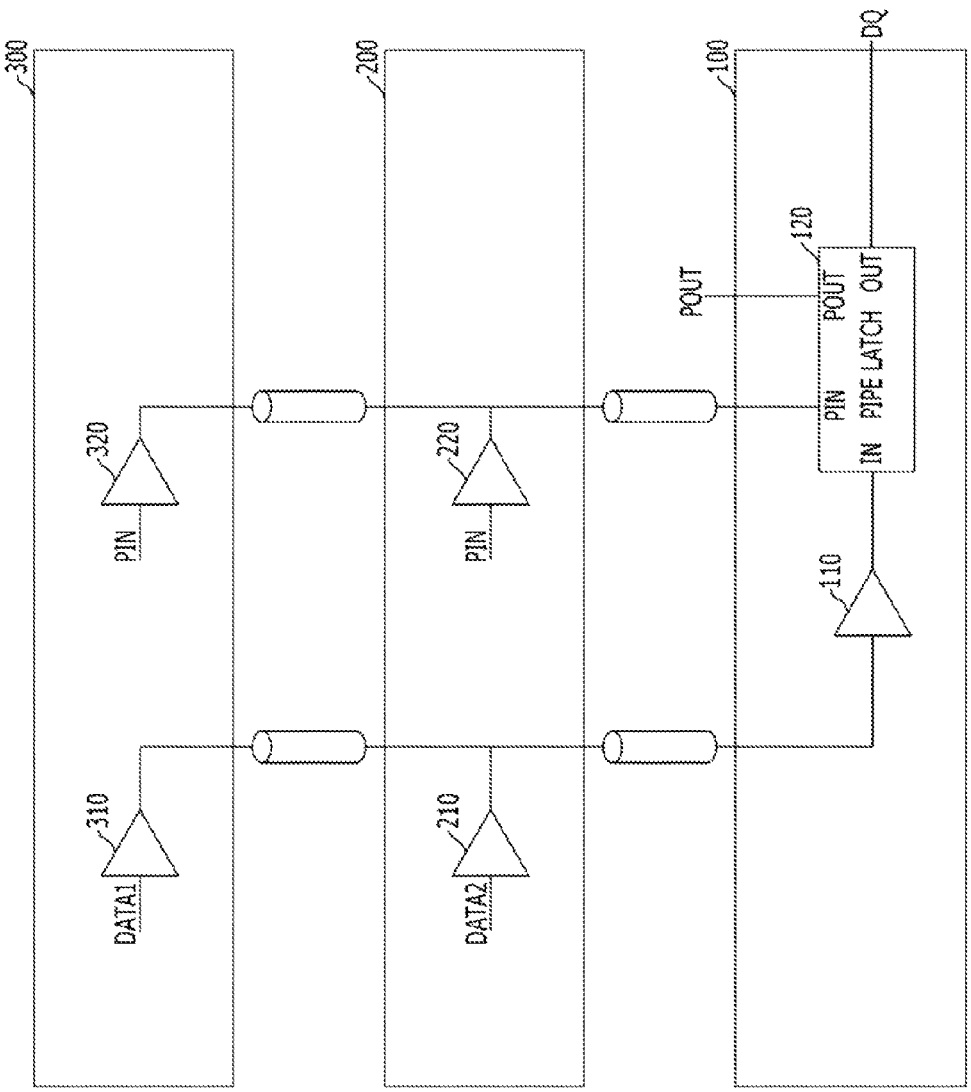
FIG. 1 is a block diagram illustrating a conventional semiconductor memory device.
Figure 2:
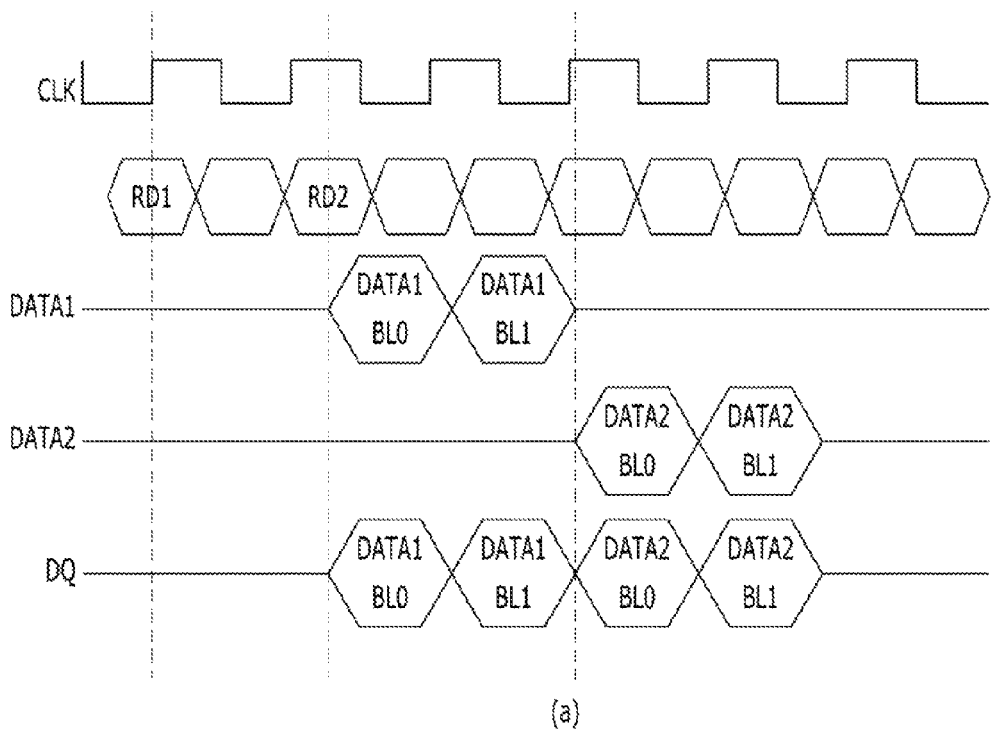
FIG. 2 illustrates timing diagrams of a data outputted from the semiconductor memory device shown in FIG. 1.
Figure 2:
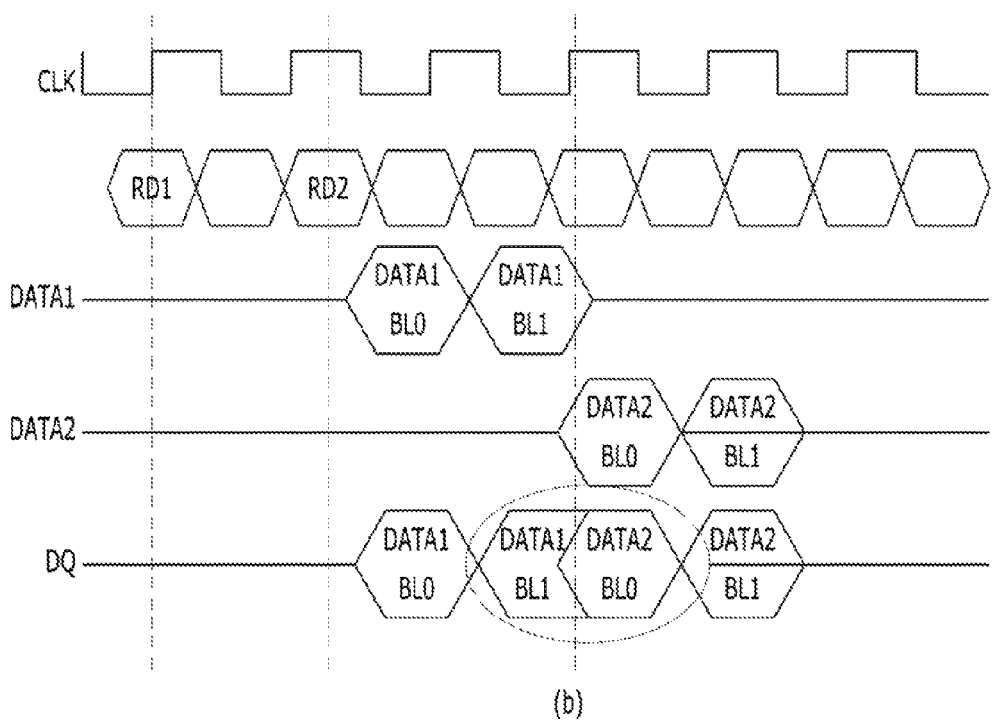

Hereafter, exemplary embodiments of the present invention are described below in more detail with reference to the accompanying drawings. Rather, these embodiments are provided so that this disclosure is thorough and complete, and fully convey the scope of the present invention to those skilled in the art. Throughout the disclosure, like reference numerals refer to like parts throughout the various figures and embodiments of the present invention.

In the drawings, a thicknesses and length of components are exaggerated compared to actual physical thickness and intervals for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

Figure 3:
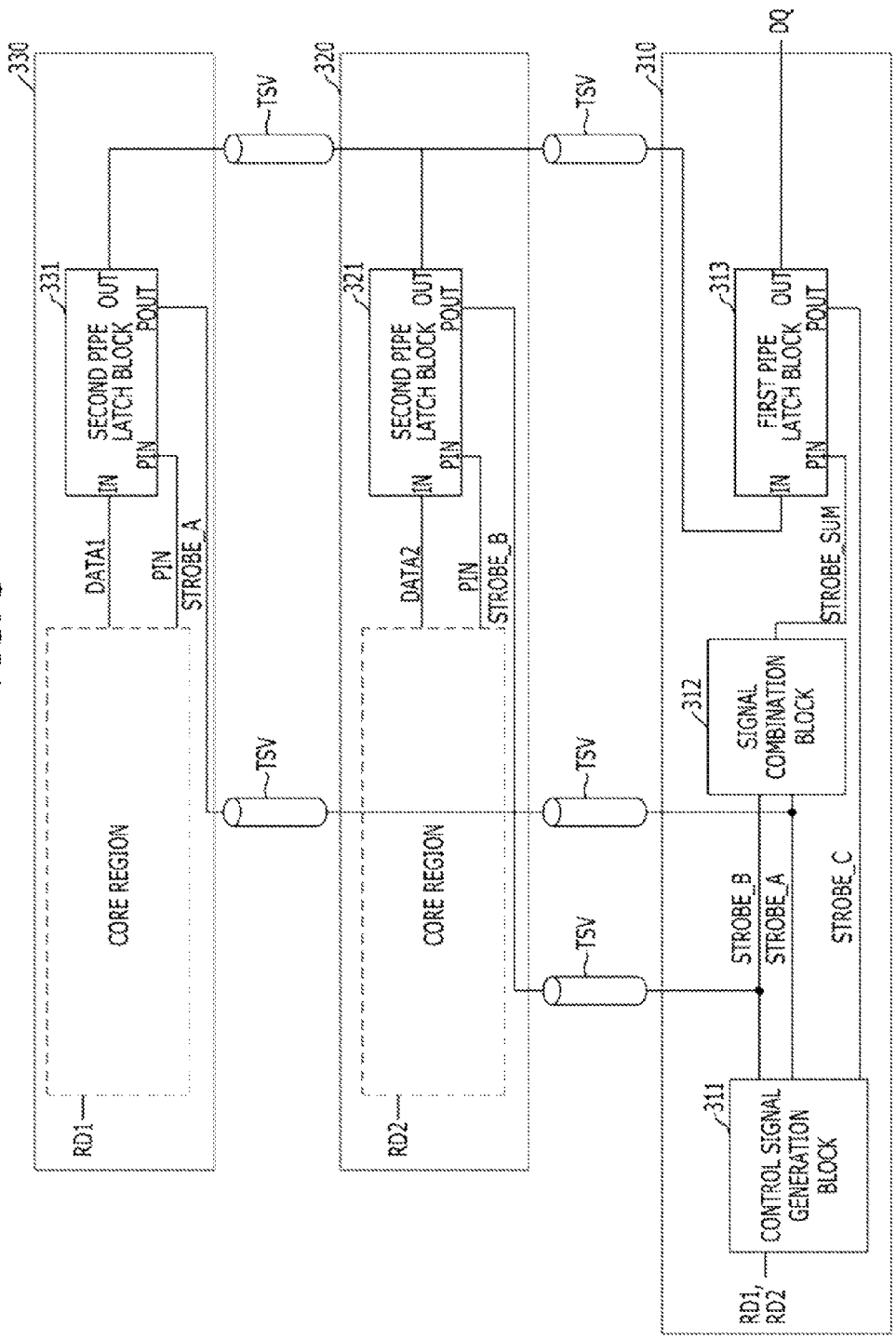
FIG. 3 is a block diagram illustrating a semiconductor memory device in accordance with an embodiment of the present invention.

FIG. 3 is a block diagram illustrating a semiconductor memory device in accordance with an embodiment of the present invention. FIG. 3 shows a data output circuit of the semiconductor memory device in which three semiconductor chips are stacked.

Referring to FIG. 3, the semiconductor memory device includes one master chip 310 and two slave chips 320 and 330. Each of the chips may transmit signals through a through-silicon via(TSV). The master chip 310 outputs data, which are transmitted through one channel from the slave chips 320 and 330, to a data pad DQ.

The master chip 310 may include a control signal generation block 311, a signal combination block 312 and a first pipe latch block 313. The control signal generation block 311 generates first control signals STROBE_A and STROBE_B corresponding to the slave chips 320 and 330 and transmits the signals to the slave chips 320 and 330, respectively based on read commands RD1 and RD2. The control signal generation block 311 generates a second control signal STROBE_C which determines the moment when the first pipe latch block 313 outputs data.

The signal combination block 312 combines the first control signals STROBE_A and STROBE_B and generates a combination signal STROBE_SUM which determines a moment when a data is inputted to the first pipe latch block 313. The signal combination block 312 may generate the combination signal STROBE_SUM by performing an OR operation on the first control signals STROBE_A and STROBE_B.

The first pipe latch block 313 latches the data transmitted from the slave chips 320 and 330 and outputs the latched data to the data pad DQ based on the second control signal STROBE_C. The first pipe latch block 313 may include a plurality of latch circuits that are coupled in parallel with each other.

The control signal generation block 311 may activate the first and second control signals STROBE_A, STROBE_B and STROBE_C according to column address strobe (CAS) latency of the semiconductor memory device. The semiconductor memory device outputs a corresponding data to the data pad DQ after the CAS latency (CL) passes from the moment when a read command is inputted. Therefore, the data is internally outputted through the pipe latch block 313 at a moment required for outputting the data ahead of the CAS latency. For example, the first pipe latch block 313 may output the data at a moment CL-3 which is a time corresponding to three clock signals CLK ahead of the CAS latency, and the control signal generation block 311 may activate the second control signal STROBE_C at the moment CL-3.

The control signal generation block 311 may activate the first control signals STROBE_A and STROBE_B at a predetermined time ahead of the activating of the second control signal STROBE_C. The moment when the first control signals STROBE_A and STROBE_B are activated may be controlled based on the number of latch circuits included in the first pipe latch block 313. When the number of the latch circuits included in the first pipe latch block 313 is large, an interval between the moments when the first control signals STROBE_A and STROBE_B and the second control signal STROBE_C are activated increases. On the other hand, when the number of the latch circuits included in the first pipe latch block 313 is small, the interval between the moments when the first control signals STROBE_A and STROBE_B and the second control signal STROBE_C are activated decreases.

The slave chips 320 and 330 include second pipe latch blocks 321 and 331, respectively. Data DATA1 and DATA2, which are read from a plurality of memory cells included in core regions of the slave chips 320 and 330 based on the respective read commands RD1 and RD2, are latched in the second pipe latch blocks 321 and 331, respectively. The second pipe latch blocks 321 and 331 transmit the latched data to the master chip 310 based on the first control signals STROBE_A and STROBE_B. The slave chips 320 and 330 may transmit the data to the master chip 310 through one channel formed of a TSV.

Each of the second pipe latch blocks 321 and 331 may include the latch circuits that are coupled in parallel with each other. The number of the latch circuits may be set in inverse proportion to the interval between the moments when the first control signals STROBE_A and STROBE_B and the second control signal STROBE_C are activated. If the interval between the moments when the first control signals STROBE_A and STROBE_B and the second control signal STROBE_C are activated is long, the second pipe latch blocks 321 and 331 latch the data and transmit the latched data to the master chip 310 after a relatively short time passes. Therefore, the second pipe latch blocks 321 and 331 may include a relatively small number of the latch circuits. On the other hand, If the interval between the moments when the first control signals STROBE_A and STROBE_B and the second control signal STROBE_C are activated is short, the second pipe latch blocks 321 and 331 latch the data and transmit the latched data to the master chip 310 after a relatively long time passes. Therefore, the second pipe latch blocks 321 and 331 may include a relatively large number of the latch circuits. As a result, the number of the latch circuits included in the second pipe latch blocks 321 and 331 is in inverse proportion to the number of the latch circuits included in the first pipe latch block 313.

Figure 4:
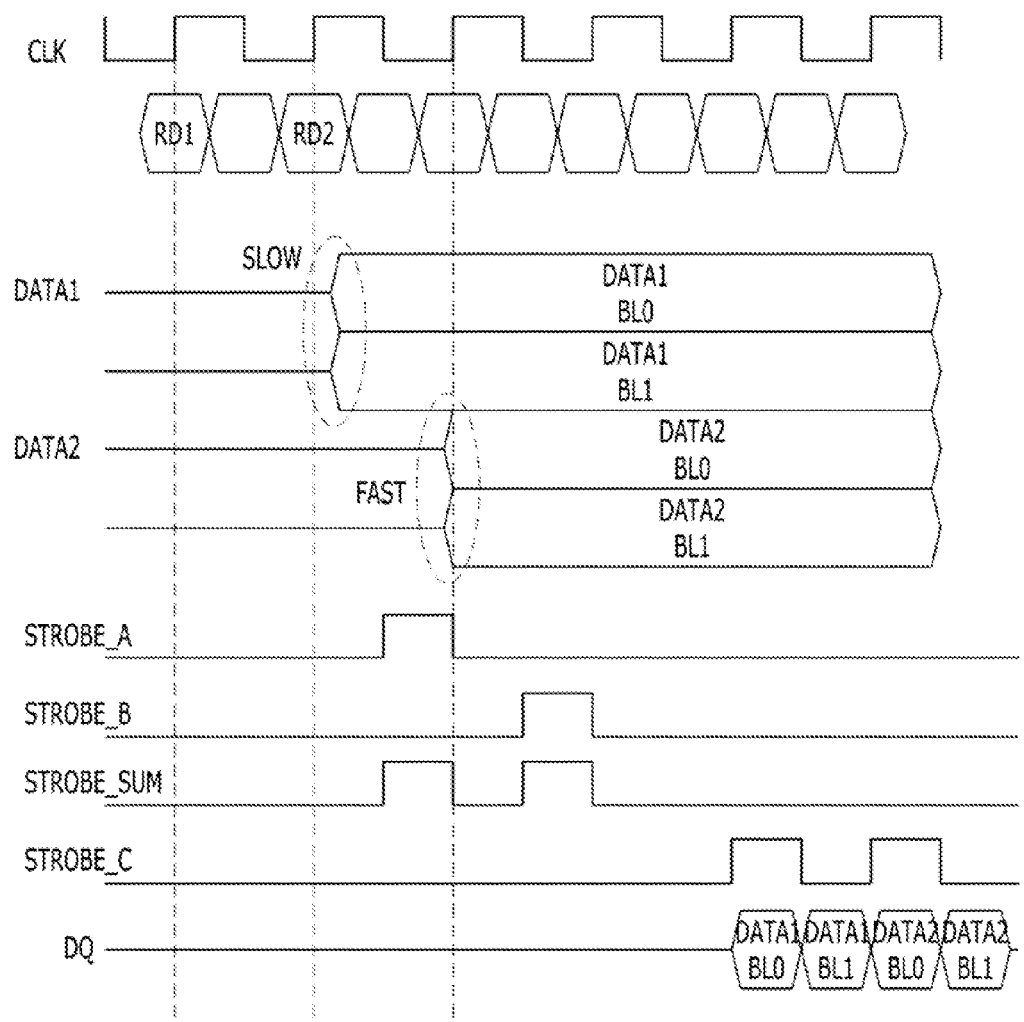
FIG. 4 illustrates timing diagrams of a data outputted from the semiconductor memory device shown in FIG. 3.

An operation of the semiconductor memory device shown in FIG. 3 is described below in detail with reference to the timing diagrams of FIG. 4 illustrating output data.

FIG. 4 illustrates timing diagrams of the data outputted from the semiconductor memory device shown in FIG. 3. FIG. 4 shows a case in which the times when the data are outputted are different due to a parameter difference between the slave chips.

Referring to FIG. 4, the data DATA1 outputted from the core region of the first slave chip 310 is outputted at a relatively late time based on the read command RD1, and the data DATA2 outputted from the core region of the second slave chip 320 is outputted at a relatively fast time based on the read command RD2. However, the data DATA1 and DATA2 are latched by the second pipe latch blocks 321 and 331, respectively.

The control signal generation block 311 of the master chip 310 may generate the first control signals STROBE_A and STROBE_B at a predetermined time based on the read commands RD1 and RD2. The second pipe latch blocks 321 and 331 may transmit the latched data DATA1 and DATA2 to the master chip 310 based on the first control signals STROBE_A and STROBE_B and the first pipe latch block 313 of the master chip 310 may latch the transmitted data based on the first control signals STROBE_A and STROBE_B. The master chip 310 may output the data latched in the first pipe latch block 313 to the data pad DQ based on the second control signal STROBE_C generated based on the read commands RD1 and RD2. Therefore, although the times of the data outputted from the core regions are different due to the parameter difference between the first slave chip 320 and the second slave chip 330, the slave chips 320 and 330 may transmit the data which are accurately combined through one channel, and the master chip 310 may output the transmitted data to an exterior at an accurate time.

As described above, in accordance with the embodiments of the present invention, the semiconductor memory device having a structure in which a plurality of memory chips are stacked may secure accurate eye patterns of output data by controlling output timings of the memory chips based on a master chip although a skew occurs between the output data due to a parameter difference between the chips. A skew difference between the data outputted from the core regions may be corrected by installing latch circuits in slave chips as well as the master chip, and the data may be accurately transmitted between the chips by controlling a data output operation of the slave chips and a data input operation of the master chip with the same signal.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

For example, although the semiconductor memory device in which the master chip and the salve chips are independently included is described in the aforementioned embodiments, the master chip may include a core region like the slave chips.

What is claimed is:

1. A semiconductor memory device, comprising:
   a master chip suitable for generating a plurality of first control signals and a second control signal based on a read command; and
   a plurality of slave chips each suitable for latching data read from a plurality of memory cells included in a corresponding slave chip and transmitting the latched data to the master chip based on a correspond control signal of the first control signals,
   wherein the master chip latches the data transmitted from the slave chips based on the first control signals and outputs the data latched in the master chip based on the second control signal,
   wherein the master chip includes a control signal generation block suitable for generating the first control signals and the second control signal in response to a column address strobe latency.

2. The semiconductor memory device of claim 1, wherein the master chip further includes:
   a signal combination block suitable for combining the first control signals and outputting a combination signal; and
   a first pipe latch block suitable for latching the data transmitted from the slave chips based on the combination signal and outputting the data latched in the first pipe latch based on the second control signal.

3. The semiconductor memory device of claim 2, wherein each of the slave chips includes:
   a second pipe latch block suitable for latching the data read from the memory cells included in a corresponding slave chip and outputting the data latched in the second pipe latch based on a corresponding first control signal.

4. The semiconductor memory device of claim 3, wherein the first pipe latch block of the master chip and the second pipe latch block of each of the slave chips include a plurality of latch circuits, and the number of the latch circuits included in the second pipe latch block are in inverse proportion to the number of the latch circuits included in the first pipe latch block.

5. The semiconductor memory device of claim 1, wherein the slave chips are stacked in an upper portion of the master chip.

6. The semiconductor memory device of claim 5, wherein the slave chips have a through-silicon via through which the data is transmitted to the master chip.

7. A semiconductor memory device, comprising:
   a plurality of stacked memory chips each suitable for reading data from a plurality of memory cells included therein in response to a read command and outputting the read data in response to a corresponding control signal of a plurality of first control signals,
   wherein a first memory chip among the memory chips includes:
     a control signal generation block suitable for generating the first control signals and a second control signal in response to a column address strobe latency; and
     a first pipe latch block suitable for latching the data outputted from the memory chips based on the first control signals and outputting the latched data to a data pad based on the second control signal.

8. The semiconductor memory device of claim 7, wherein the first memory chip further includes:
   a signal combination block suitable for combining the first control signals and transmitting the combined signals to the first pipe latch block.

9. The semiconductor memory device of claim 7, wherein each of the memory chips includes:

a second pipe latch block suitable for latching the read data and outputting the data latched in the second pipe latch block based on a corresponding first control signal.

10. The semiconductor memory device of claim 9, wherein the first and second pipe latch blocks include a plurality of latch circuits, and the number of the latch circuits included in the second pipe latch block are in inverse proportion to the number of the latch circuits included in the first pipe latch block.

11. The semiconductor memory device of claim 7, wherein the memory chips have a through-silicon via through which the data is transmitted.

* * * * *